United States Patent [19]

Stoehr

[11] Patent Number: 4,908,571

[45] Date of Patent: Mar. 13, 1990

[54] CONTACT PROBE ASSEMBLY WITH FINE POSITIONING MEANS

[75] Inventor: Roland R. Stoehr, Nufringen, Fed. Rep. of Germany

[73] Assignee: International Business Machines Corporation, Armonk, N.Y.

[21] Appl. No.: 183,552

[22] Filed: Apr. 19, 1988

[30] Foreign Application Priority Data

May 26, 1987 [EP] European Pat. Off. ........ 87107669.1

[51] Int. Cl.⁴ ..................... G01R 1/06; G01R 31/02
[52] U.S. Cl. .................. 324/158 P; 324/72.5; 324/158 F
[58] Field of Search ........... 324/158 F, 158 P, 73 PC, 324/72.5

[56] References Cited

U.S. PATENT DOCUMENTS

| | | | |
|---|---|---|---|
| 3,787,768 | 1/1974 | Kubota et al. | 324/158 F |
| 4,063,172 | 12/1977 | Faure et al. | 324/158 P |
| 4,471,298 | 9/1984 | Frohlich | 324/158 F |
| 4,686,464 | 8/1987 | Elsasser et al. | 324/158 P |

Primary Examiner—Ernest F. Karlsen
Attorney, Agent, or Firm—Jeffery L. Brandt; Alexander Tognino

[57] ABSTRACT

A contact probe assembly is described comprising a motor-driven fine positioning means. The fine positioning means permits the contact probe assembly to move in two directions X and Y which are perpendicular to each other. For positioning several contact probe assemblies, provided with fine positioning means, closely adjacent to each other, the longitudinal axis of each fine positioning means extends perpendicularly to the plane defined by the X and the Y direction. An electromotor is provided for either direction of movement. In one embodiment, fine positioning in either direction is effected by a perpendicularly arranged hollow shaft, the lower end of which is eccentrically shaped, reciprocally moving a carrier slide which is permanently connected to the contact probe assembly. The hollow shaft for moving the contact probe assembly in the Y direction is arranged inside the hollow shaft for movement in the X direction. The travel performed is detected by sensors. In a second embodiment, the contact probe assembly is fine positioned by means of wedges, two of which connected to each other by a seesaw, rest on opposite surfaces of a quadrangular pyramid frustrum which is permanently connected to the contact probe assembly. The up and down movement of the wedges fine positions the contact probe assembly in the X and the Y direction, respectively.

5 Claims, 3 Drawing Sheets

CONTACT PROBE ASSEMBLY WITH FINE POSITIONING MEANS

BACKGROUND OF THE INVENTION

1. Field of the Invention

The invention relates to a contact probe assembly with fine positioning means.

2. Related Art

Contact probe contactors have been utilized for testing the electrical characteristics of integrated circuits connected to pads on a semiconductor chip. The probe wires of the probe assembly engage the pads to electrically connect the pads in parallel to the test apparatus. Limited force application is needed to prevent damage to the pads or the microelectronic circuit. Additionally, since the pads are located in close proximity, thin deflectable wires functioning as buckling beams must have their contact tips accurately positioned with respect to the pads to prevent shorts between circuits.

European patent application No. 87 104 577.9 describes a contact probe assembly for electrically connecting a test unit to the circular connector pads of a device to be tested. By using a stack of plates, provided with oblong holes, which serve as contact probe guides, this assembly permits employing contact probes of reduced diameter and obtaining, even in view of reduced diameter probes, a low contact resistance between the contact probe and the connector pad of the device to be tested. This is essential for reliable test results.

For reducing the time required for testing devices with regularly recurring patterns of connector pads, it is known to combine several contact probe assemblies in the form of a test head, such as that described in the U.S. Pat. No. 4,686,464 and to use the totality of contact probe assemblies to simultaneously contact the connector pad patterns. This is possible, only, if during the manufacture of the device to be tested, the associated connector pads only differ slightly from the desired dimensions. However, if there are greater differences, such simultaneous contacting of the various patterns by a test head comprising several contact probe assemblies will not yield reliable test results. The contact probes, as a result of the distortions occurring on the device to be tested during the manufacturing process, either fail to contact their associated pads or they contact pads associated with adjacent probes.

It is the object of the subject invention to solve this problem of aligning the contact probe to the pads by providing a contact probe assembly which yields reliable test results even if several contact probe assemblies are combined to form a single test head and the connector pads do not align exactly to said head.

The foregoing and other objects, features and advantages of the invention will be apparent from the following more particular description of the invention as illustrated in the accompanying drawings.

SUMMARY OF THE INVENTION

Figure 4:
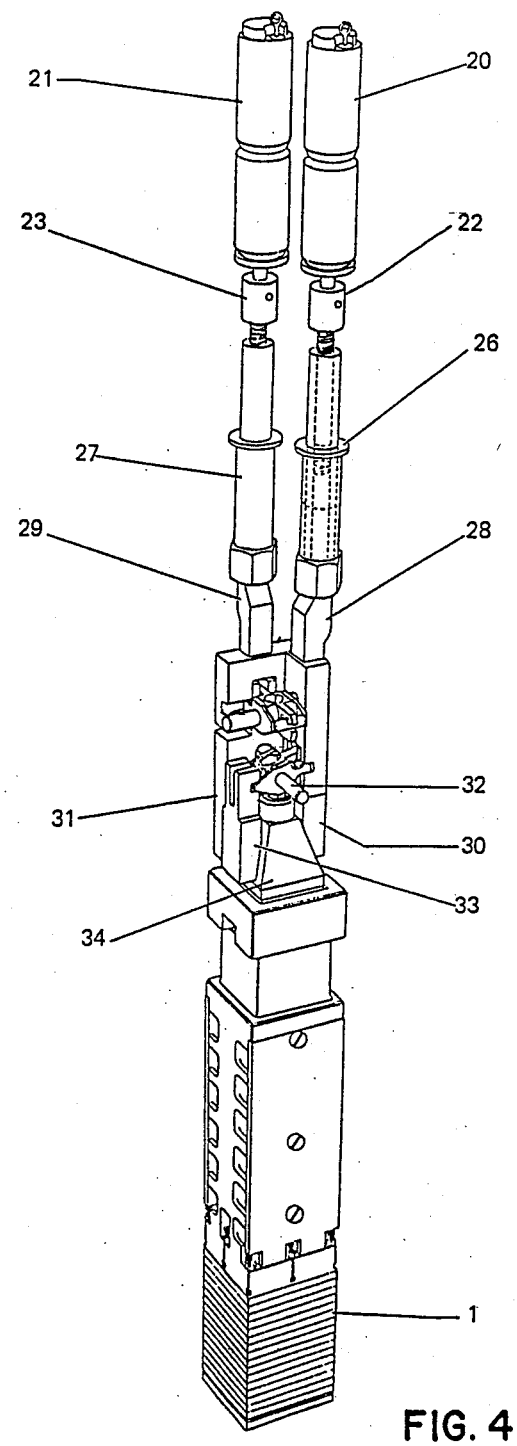
FIG. 4 is a simplified perspective view of a second embodiment of a fine positioning means according to the invention for a contact probe assembly.
Figure 5:
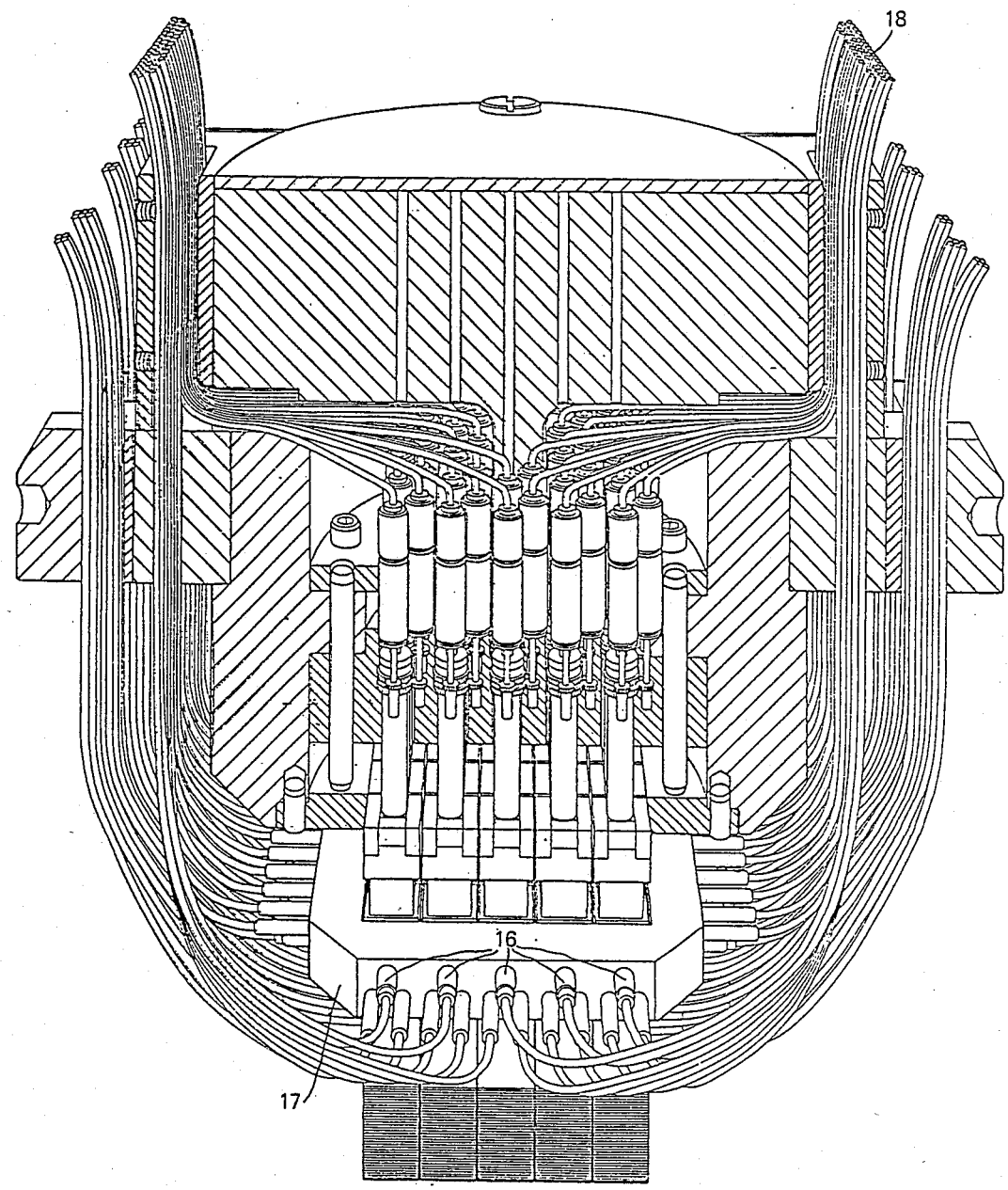
FIG. 5 is a sectional perspective view of a test head made up of contact probe assemblies which are provided with fine positioning means according to FIG. 1.

A contact probe assembly 1 is described comprising a motor-driven fine positioning means. The fine positioning means permits the contact probe assembly 1 to move in two directions X and Y which are perpendicular to each other. For positioning several contact probe assemblies 1, provided with fine positioning means, closely adjacent to each other, the longitudinal axis of each fine positioning means extends perpendicularly to the plane defined by the X and the Y direction. An electromotor (FIG. 1 ,2, 3; FIG. 4) 20, 21 is provided for either direction of movement. In the FIG. 1 embodiment, fine positioning in either direction is effected by a perpendicularly arranged hollow shaft 10, 11, the lower end of which is eccentrically shaped, and a reciprocally moving carrier slide 13, 14 which is permanently connected to the contact probe assembly 1. The hollow shaft 11 for moving the contact probe assembly 1 in the Y direction is arranged inside the hollow shaft 10 for movement in the X direction. The travel performed is detected by sensors 16, FIG. 5.

In an alternate embodiment FIG. 4, the contact probe assembly is fine positioned by means of wedges 30, 31, 33, two of which 30, 33, connected to each other by a seesaw 32, rest on opposite surfaces of a quadrangular pyramid frustrum 34 which is permanently connected to the contact probe assembly 1. The up and down movement of the wedges, fine position the contact probe assembly in the X and the Y direction, respectively.

DETAILED DESCRIPTION OF THE INVENTION

Figures 1, 2, 3:
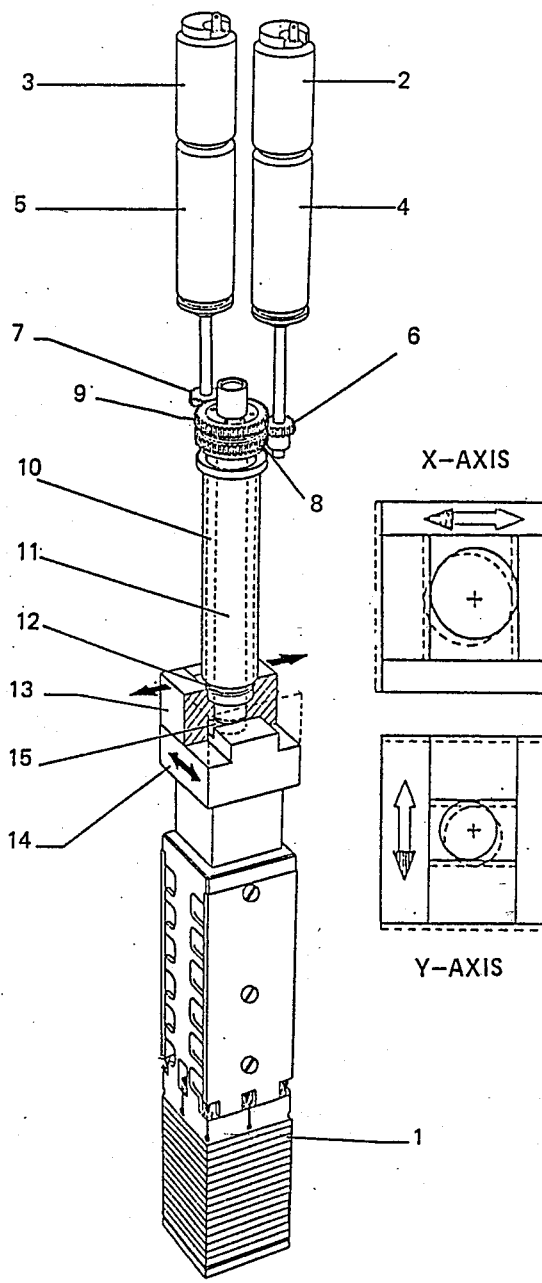
FIG. 1 is a simplified perspective, partly sectional, representation of a first embodiment of a contact probe assembly provided with fine positioning means according to the invention, from which bearings and fixing means have been omitted for clarity.
FIG. 2 is a drawing showing fine positioning in the X direction.
FIG. 3 is a drawing showing fine positioning in the Y direction perpendicular to the X direction.

FIG. 1 shows one embodiment of a contact probe assembly 1 which is provided with a means according to the invention for fine positioning in two directions that are perpendicular to each other and that are referred to as X and Y direction, respectively. It will be recognized by those skilled in the art that contact probe assembly 1 is comprised of a maxtrix of a number of electrically conducting test leads, for example, wires (not shown) with said test wires being of a diameter of approximately 0.10 mm depending on the specific test wire used. Fine positioning is possible to within a range of $+/-2$ wire diameters in the X and Y directions and resolution to within 1um is obtainable. For movement in either direction, motors 2 and 3, respectively, are provided. Motor 2 is connected to a gear 4 and motor 3 to a gear 5, whose driven shafts carry drive gears 6 and 7 interacting with a gear 8 and 9, respectively. Gears 8 and 9 are positioned on hollow shafts 10 and 11. Hollow shaft 10 effects the fine positioning of the contact probe assembly 1 in the X direction.

FIG. 2 is a plan view of the follower means 13 and the shaft 10, moving said follower means, along with its eccentrically shaped lower end 12. For this purpose, its lower end 12 is eccentrically shaped and supported in a follower means 13 which, upon rotation of the eccentric end 12 of the hollow shaft 10, moves the connected contact probe assembly 1 in the X direction to the left or right, as shown in FIG. 2.

As shown in FIG. 1, hollow shaft 11 is provided within the perpendicularly positioned hollow shaft 10 for moving the contact probe assembly 1 in the Y direction which is perpendicular to the X direction. The upper end of hollow shaft 11 supports a gear 9 which, similar to that of the other hollow shaft 10, is driven by a gear 7. The lower end of hollow shaft 11 is also eccentrically shaped, so that a second follower means 14, positioned below the first follower means 13 and permanently connected thereto and to the contact probe assembly, is reciprocally moved by eccentric 15 in the Y direction. As shown in FIG. 3, the hatched arrow tip indicates the forward direction of movement. When an eccentric is used as a drive element which converts a rotary movement into a reciprocal one, there is no linear relation between the angle of rotation and the displacement in one direction. However, for fine positioning the contact probe assembly, information on the travel performed is indispensable. Therefore, as shown in the perspective sectional view of FIG. 5, each contact probe assembly 1 is provided with a sensor 16 supplying information on the travel performed during the fine positioning of the contact probe assembly 1. Sensors 16 may take the form of known inductive displacement transducers. They are positioned in the bores of a stationary frame 17 which is permanently connected to the housing of the test head comprising a number of contact probe assemblies 1. Each sensor 16 emits a signal if the spacing between its tip and its associated contact probe assembly 1 changes. The signal is fed by a cable 18, shown in FIG. 5, to a control circuit for the drive motors of the contact probe assemblies 1.

FIG. 4 shows an alternate embodiment of a contact probe assembly 1 which is suitable for fine positioning. Similar to the FIG. 1, there are two drive motors 20 and 21, of which motor 20 fine positions the contact probe assembly in the X direction and motor 21 does the same in the Y direction. Through a coupling means 22 and 23, respectively, and a differential thread 26 and 27, respectively, each motor shaft is connected to a fork-shaped element 28 and 29, respectively, carrying on its lower end a wedge 30 and 31, respectively. A quadrangular pyramid frustrum 34 is permanently connected to the contact probe assembly 1. The two wedges 30 and 33, which are associated with one of the two directions of movement, rest on opposite side faces of the frustrum. The two wedges 30 and 33 serve to move the contact probe assembly in the X direction. Of the two wedges for movement in the Y direction, FIG. 4 shows only the rear wedge 31 for clarity. For moving the contact probe assembly 1, for example, slightly to the right, the fork-shaped element 30 is moved upwards, causing wedge 30, positioned at its lower end, to be lifted slightly off the side face of the pyramid frustrum 34, while wedge 33 is simultaneously moved downwards via the left arm of a seesaw 32 on the side face of the pyramid frustrum. As a result, the contact probe assembly is moved slightly to the right. The right arm of the seesaw 32 engages a recess of the fork-shaped element 28. For a movement to the left, the fork-shaped element 28 is moved slightly downwards, so that seesaw 32 lifts wedge 33 slightly off the pyramid frustrum. The downward movement of wedge 30 permits the contact probe assembly 1 to move slightly to the left. This applies analogously to movement in the direction perpendicular to that described.

In contrast to the FIG. 1, FIG. 4 does not require sensors, as the respective travel performed is derived from the motor revolutions by a coding means (not illustrated) incorporated in the motors.

While the invention has been described with respect to particular embodiments thereof, it will be apparent to those of skill in the art, that modifications may be made thereto without departing from the spirit and scope of the present invention.

I claim:

1. In a system for the testing of the electrical characteristics of semiconductor devices wherein a contact probe assembly with a head comprising a maxtrix of test probe leads of millimeter diameter, electrically conductive wires which are arranged to contact the connector pads on said semiconductor device, the improvement to said contact probe assembly comprising: (a) a fine positioning means for aligning said wires to within a range of +/− 2 wire diameters to said pads, said positioning means having a motor-driven means which permits moving the contact probe assembly in two directions which are perpendicular to each other with the longitudinal axis of the positioning means being perpendicular to the plane defined by the two directions of movement with said fine positioning in the two directions which are perpendicular to each other being effected by a hollow shaft with a lower eccentrically shaped end such that upon rotation of said shaft, a follower slide, permanently connected to the contact probe assembly, is reciprocally moved, transferring its movement thereto.

2. Contact probe assembly according to claim 1 wherein the hollow shaft for the second direction of movement extends inside the hollow shaft for the first direction of movement.

3. Contact probe assembly according to claim 2 wherein the position reached by the contact probe assembly in response to the rotation of the hollow shafts is determined by a sensor operating as an inductive displacement transducer.

4. In a system for the testing of the electrical characteristics of semiconductor devices including a contact probe assembly with a head comprising a matrix of test probe leads of millimeter diameter, and electrically conductive wires which are arranged to contact the connector pads on said semiconductor device, the improvement to said contact probe assembly comprising: a fine positioning means for aligning said wires to within a range of +/−2 wire diameters to said pads, said positioning means having a motor-driven means which permits moving the contact probe assembly in two directions which are perpendicular to each other with the longitudinal axis of the positioning means being perpendicular to the plane defined by the two directions of movement, wherein said fine positioning in either of the two perpendicular directions is effected by first wedges and by second wedges resting on side faces of a quadrangular pyramid frustrum permanently connected to the contact probe assembly, said first wedges, upon being raised and lowered, shifting the contact probe assembly to the right or left, and said second wedges, upon being raised and lowered, shifting the contact probe assembly forwards and backwards.

5. Contact probe assembly according to claim 5 wherein the first or second wedges associated with one of the two directions of movement are interconnected by a seesaw one arm of which engages the recess of a fork-shaped element having one wedge positioned at its lower end and the other arm of which is connected to another wedge.

* * * * *

UNITED STATES PATENT AND TRADEMARK OFFICE
CERTIFICATE OF CORRECTION

PATENT NO. : 4,908,571
DATED : March 13, 1990
INVENTOR(S) : Roland R. Stoehr

It is certified that error appears in the above-identified patent and that said Letters Patent is hereby corrected as shown below:

In column 1, line 46, change "thedistortions" to read -- the distortions --.

In claim 5, line 1, change "claim 5" to read -- claim 4 --.

Signed and Sealed this

Fifth Day of May, 1992

Attest:

DOUGLAS B. COMER

*Attesting Officer*      *Acting Commissioner of Patents and Trademarks*